United States Patent
Satoh et al.

(10) Patent No.: US 10,666,466 B2
(45) Date of Patent: May 26, 2020

(54) SEMICONDUCTOR INTEGRATED CIRCUIT, RECEIVING DEVICE, AND COMMUNICATION SYSTEM

(71) Applicant: Toshiba Memory Corporation, Tokyo (JP)

(72) Inventors: Yuji Satoh, Kawasaki Kanagawa (JP); Yutaka Shimizu, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/285,914

(22) Filed: Feb. 26, 2019

(65) Prior Publication Data

US 2020/0092143 A1 Mar. 19, 2020

(30) Foreign Application Priority Data

Sep. 19, 2018 (JP) .................. 2018-174654

(51) Int. Cl.
| | |
|---|---|
| H04L 25/02 | (2006.01) |
| H04B 3/06 | (2006.01) |
| H04L 25/49 | (2006.01) |
| H03K 5/24 | (2006.01) |
| G01R 31/319 | (2006.01) |

(52) U.S. Cl.
CPC ....... *H04L 25/0272* (2013.01); *H03K 5/2481* (2013.01); *H04B 3/06* (2013.01); *H04L 25/4917* (2013.01); *G01R 31/31924* (2013.01)

(58) Field of Classification Search
CPC .......... G01R 31/31924; G01R 13/0218; H03K 17/6872; H03K 7/02; G01D 5/24466; G01D 5/24476

USPC ......................................... 375/257
See application file for complete search history.

(56) References Cited

U.S. PATENT DOCUMENTS

| | | | |
|---|---|---|---|
| 9,571,309 B1 | 2/2017 | Sakai | |
| 9,800,436 B2 | 10/2017 | Sakai | |
| 2006/0182193 A1* | 8/2006 | Monsen | ............ H04L 25/03057 375/267 |
| 2009/0238301 A1 | 9/2009 | Cheung | |
| 2018/0183422 A1* | 6/2018 | Yasotharan | ............ H03K 5/249 |

FOREIGN PATENT DOCUMENTS

| | | |
|---|---|---|
| JP | 2009-231954 A | 10/2009 |
| JP | 2017-041825 A | 2/2017 |
| JP | 2017-118394 A | 6/2017 |

\* cited by examiner

*Primary Examiner* — Leila Malek
(74) *Attorney, Agent, or Firm* — Kim & Stewart LLP

(57) ABSTRACT

A semiconductor integrated circuit includes a pair of differential signal lines including first and second signal lines, a first comparator, and a second comparator. The first comparator is configured to output at least one of a first signal corresponding to a difference between a potential of a first input node and a potential of a second input node, and a second signal corresponding to a difference between a potential of a third input node and a potential of a fourth input node. The second comparator is configured to output at least one of a third signal corresponding to a difference between a potential of a fifth input node and a potential of a seventh input node, and a fourth signal corresponding to a difference between a potential of a sixth input node and a potential of a eighth input node.

20 Claims, 11 Drawing Sheets

| POLARITY SIGNAL $\phi V_P$ | AMPLITUDE SIGNAL $\phi V_A$ | DATA VALUE |
|---|---|---|
| 1 | 1 | 3 |
| 1 | 0 | 2 |
| 0 | 0 | 1 |
| 0 | 1 | 0 |

US 10,666,466 B2

SEMICONDUCTOR INTEGRATED CIRCUIT, RECEIVING DEVICE, AND COMMUNICATION SYSTEM

CROSS-REFERENCE TO RELATED APPLICATION

This application is based upon and claims the benefit of priority from Japanese Patent Application No. 2018-174654, filed on Sep. 19, 2018, the entire contents of which are incorporated herein by reference.

FIELD

Embodiments described herein relate generally to a semiconductor integrated circuit, a receiving device, and a communication system.

BACKGROUND

In a semiconductor integrated circuit having a differential configuration, a differential signal is received and data is restored from the differential signal. In such a circuit, it is desirable to restore data with low power consumption.

DETAILED DESCRIPTION

Embodiments provide a semiconductor integrated circuit, a receiving device, and a communication system suitable for restoring data with low power consumption.

According to an embodiment, a semiconductor integrated circuit includes a pair of differential signal lines including first and second signal lines, a first comparator, and a second comparator. The first comparator includes a first input node electrically connected to the first signal line, a second input node electrically connectable to a first reference terminal at a first reference voltage, a third input node electrically connected to the second signal line, and a fourth input node electrically connectable to a second reference terminal at a second reference voltage different from the first reference voltage. The first comparator is configured to output at least one of a first signal corresponding to a difference between a potential of the first input node and a potential of the second input node, and a second signal corresponding to a difference between a potential of the third input node and a potential of the fourth input node. The second comparator includes a fifth input node electrically connected to the first signal line, a sixth input node electrically connected to the second signal line, a seventh input node electrically connectable to a third reference terminal at a third reference voltage different from the first reference voltage and the second reference voltage, and an eighth input node electrically connectable to a fourth reference terminal at a fourth reference voltage different from the first reference voltage and the second reference voltage. The second comparator is configured to output at least one of a third signal corresponding to a difference between a potential of the fifth input node and a potential of the seventh input node, and a fourth signal corresponding to a difference between a potential of the sixth input node and a potential of the eighth input node.

Hereinafter, a semiconductor integrated circuit according to embodiments will be described in detail with reference to the accompanying drawings. The present disclosure is not limited by these embodiments.

Embodiment

Figure 1:
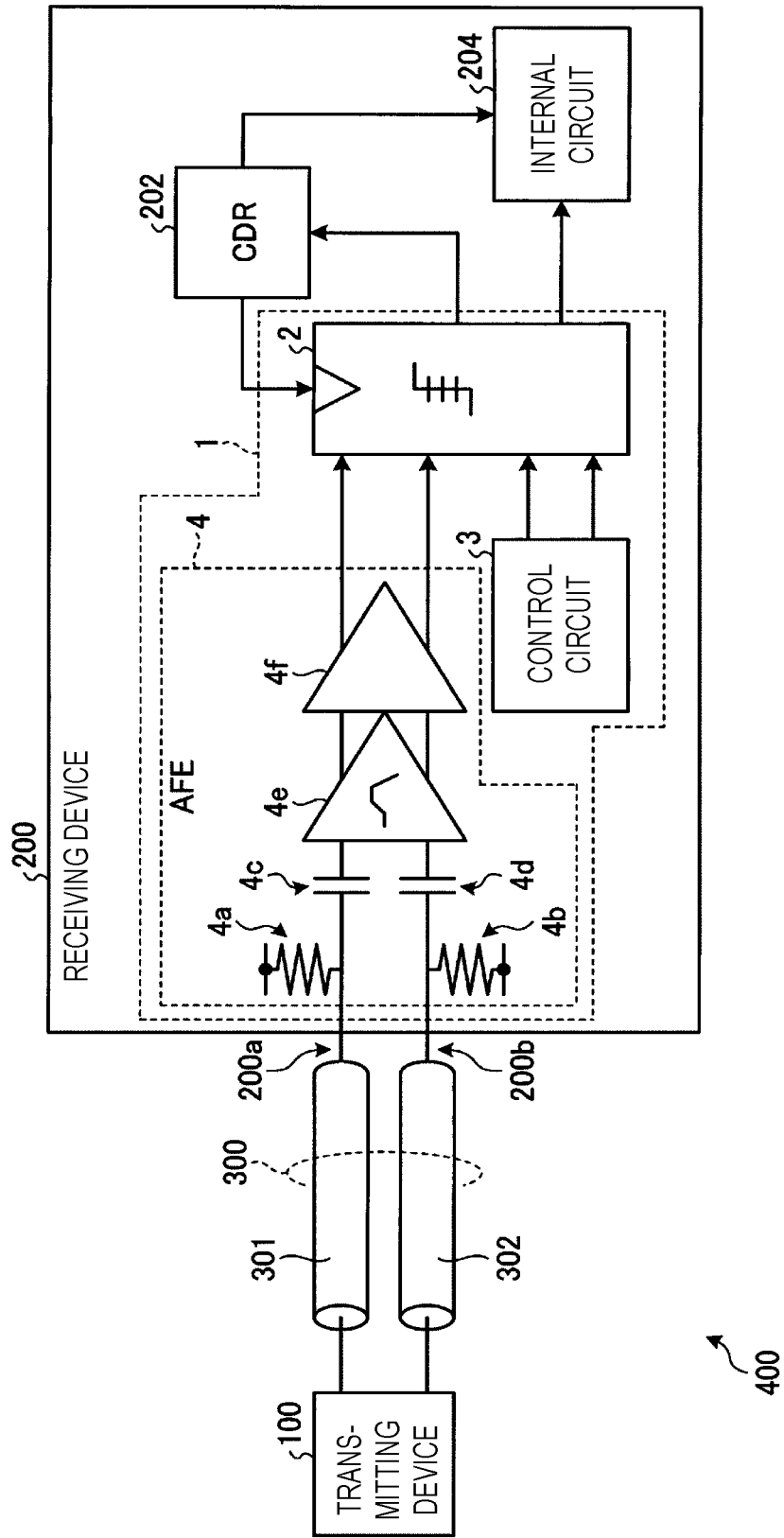
FIG. 1 is a diagram illustrating a configuration of a communication system including a semiconductor integrated circuit according to an embodiment.

The semiconductor integrated circuit according to an embodiment is used, for example, in a communication system that performs wired communication. For example, a communication system 400 including a semiconductor integrated circuit 1 is configured as illustrated in FIG. 1. FIG. 1 is a diagram illustrating the configuration of the communication system 400 including the semiconductor integrated circuit 1.

The communication system 400 includes a transmitting device 100, a receiving device 200, and a wired communication path 300. The transmitting device 100 and the receiving device 200 are communicably connected to each other via the wired communication path 300. The transmitting device 100 transmits particular data to the receiving device 200 via the wired communication path 300. The wired communication path 300 is configured in a differential manner, and includes a P-side communication path 301 and an N-side communication path 302. The receiving device 200 receives particular data from the transmitting device 100 via the wired communication path 300. The receiving device 200 includes receiving nodes 200a and 200b, the semiconductor integrated circuit 1, a clock data recovery (CDR) circuit 202, and an internal circuit 204. The wired communication path 300 is connectable to the receiving nodes 200a and 200b. The semiconductor integrated circuit 1 is disposed on output sides of the receiving nodes 200a and 200b.

The semiconductor integrated circuit 1 includes an analog front end (AFE) 4, a sampler 2, and a control circuit 3.

The AFE 4 includes pull-up resistors 4a and 4b, coupling capacitors 4c and 4d, an equalizing circuit 4e, and a driver 4f. The equalizing circuit 4e performs a continuous time linear equalizer (CTLE) processing and performs a signal equalization with a gain characteristic corresponding to, for example, an inverse characteristic of an attenuation characteristic of the wired communication path 300. The driver 4f drives the equalized signal and transmits the signal to the sampler 2 side.

The sampler 2 receives a differential signal from the AFE 4 and receives a control signal from the control circuit 3. The sampler 2 identifies data value corresponding to the received signal using the control signal, and supplies the identification result of the data value to the CDR 202 and the internal circuit 204.

A modulation method which is mainly used in the wired communication is an amplitude modulation, and a binary modulation method such as an NRZ may be implemented. In the NRZ, an increase in the transmission rate may be implemented in the direction of increasing bandwidth, but different means have been studied due to restrictions on the communication path. One of these is a multi-value amplitude modulation method in which multi-valued data is represented in the amplitude direction (e.g., a quaternary amplitude modulation method: PAM4). At this time, the sampler 2 in the receiving device 200 may identify the data by executing [(number of states that the data may take)–1] threshold value determinations. In the case of the PAM4, the data represented in the amplitude direction may be identified by three threshold value determinations.

As a method of configuring a sampler, for example, a first method of configuring a sampler is conceivable using [(number of states that the data may take)–1] comparators. In the case of the PAM4, the sampler may be configured with three comparators. In the first method, as the number of states that the data may take increases, the number of comparators constituting the sampler increases, so that power consumption and processing load on the AFE 201 in the front end of the sampler increases exponentially, which may lead to a reduction in power efficiency.

Figure 2A:
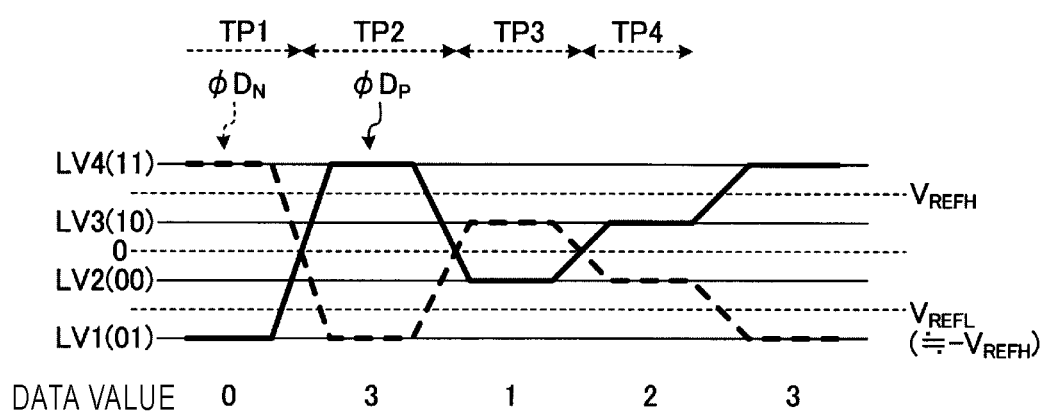
FIGS. 2A and 2B are waveform diagrams illustrating differential signals in the embodiment.
Figure 2B:
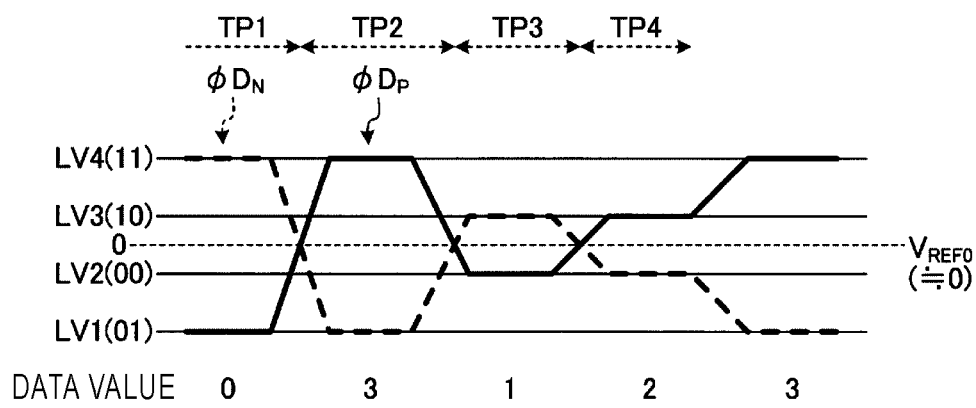

In the meantime, differential signals φPDP and φDN received by the sampler 2 may be changed according to the type of data (i.e., whether the data value is any one of four (4) values, 0 (LV1), 1 (LV2), 2 (LV3), and 3 (LV4)), as illustrated in FIGS. 2A and 2B. FIGS. 2A and 2B are waveform diagrams illustrating differential signals, respectively, and the median value of the amplitude of the differential signal φΔD(=φDP−φDN) is set to 0. That is, as illustrated in FIG. 2A, for example, whether the signal levels of the differential signal φDP are LV2 and LV3 or LV1 and LV4 may be specified by determining whether the absolute values of the amplitudes of the differential signals φDP and φDN are smaller than VREFH. Further, as illustrated in FIG. 2B, for example, whether the signal levels of the differential signal φDP are LV1 and LV2 or LV3 and LV4 may be specified by determining whether the polarity of the differential signals φDP and φDN is (−,+) or (+,−).

According to the present embodiment, in the semiconductor integrated circuit 1, the number of comparators used in the sampler operation is reduced and the power consumption is reduced by configuring the sampler 2 using the comparator for polarity determination and the comparator for amplitude absolute value determination.

Figure 3:
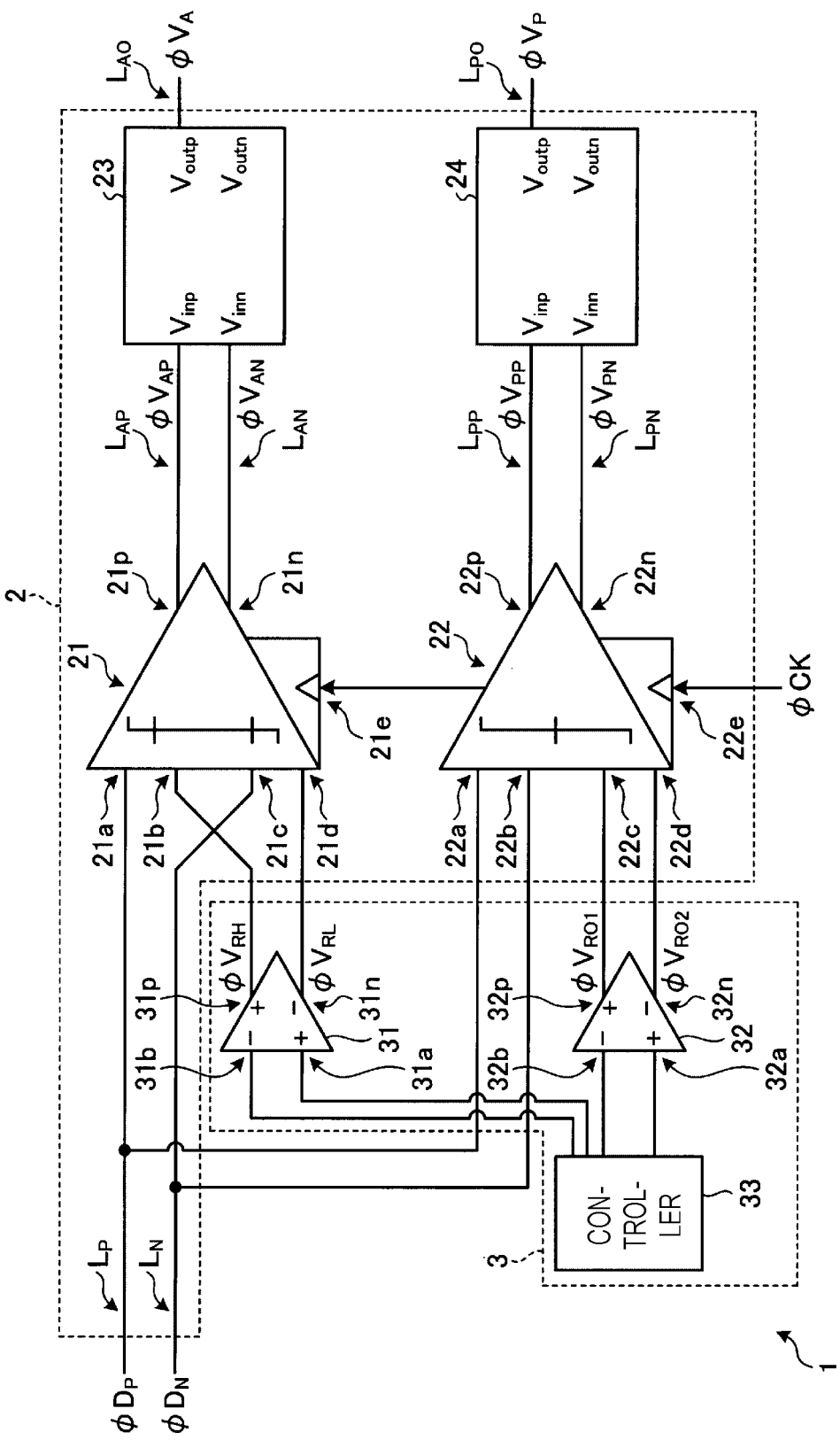
FIG. 3 is a circuit diagram illustrating a configuration of the semiconductor integrated circuit according to the embodiment.

Specifically, the semiconductor integrated circuit 1 may be configured as illustrated in FIG. 3. FIG. 3 is a diagram illustrating the configuration of the semiconductor integrated circuit 1. In FIG. 3, the illustration of the AFE 4 is omitted for the sake of simplicity. The semiconductor integrated circuit 1 includes the AFE 4, the sampler 2, and the control circuit 3 as described above. The sampler 2 includes a signal line $L_P$, a signal line $L_N$, a comparator 21, a comparator 22, a signal line $L_{AP}$, a signal line $L_{AN}$, a signal line $L_{PP}$, a signal line $L_{PN}$, an SR latch 23, an SR latch 24, an output line $L_{AO}$, and an output line $L_{PO}$. The control circuit 3 includes a controller 33, a reference voltage generating circuit 31, and a reference voltage generating circuit 32.

In the sampler 2, the comparator 21 is a comparator that determines the amplitude absolute value, and the comparator 22 is a comparator that determines the polarity. The reference voltage generating circuit 31 in the control circuit 3 generates a reference voltage for amplitude absolute value determination and supplies the reference voltage to the comparator 21. The reference voltage generating circuit 32 in the control circuit 3 generates a reference voltage for polarity determination and supplies the reference voltage to the comparator 22. The comparator 21 performs a determination using the reference voltage for amplitude absolute value determination for the differential signals φDP and φDN input to the sampler 2, and supplies the differential signals $\varphi V_{AP}$ and $\varphi V_{AN}$ as the amplitude absolute value determination results to the SR latch 23. The SR latch 23 latches the differential signals $\varphi V_{AP}$ and $\varphi V_{AN}$ as a set input (Vinp) and a reset input (Vinn), respectively, and outputs the result (Voutp) as an amplitude signal φVA. The comparator 22 performs a polarity determination on the differential signals $\varphi D_P$ and $\varphi D_N$ input to the sampler 2 using the reference voltage for polarity determination, and supplies the differential signals $\varphi V_{PP}$ and $\varphi V_{PN}$ which are the polarity determination results to the SR latch 24. The SR latch 24 outputs the result (Voutp) obtained by latching the differential signals $\varphi V_{PP}$ and $\varphi V_{PN}$ as a set input (Vinp) and a reset input (Vinn), respectively, as a polarity signal φVP.

The CDR 202 that receives the amplitude absolute value determination result and the polarity determination result may restore the data value and reproduce clock φCK using the restored data value to supply the clock φCK to the sampler 2 and the internal circuit 204. Further, the internal circuit 204 that receives the amplitude absolute value determination result and the polarity determination result may restore the data value and perform a processing using the restored data value and the clock φCK.

More specifically, in the control circuit 3, the controller 33 supplies control signals to the reference voltage generating circuit 31 and the reference voltage generating circuit 32, respectively, and controls these circuits.

The reference voltage generating circuit 31 includes an input node 31a, an input node 31b, an output node 31p, and an output node 31n. The reference voltage generating circuit 31 may be implemented by a differential amplifier. When the reference voltage generating circuit 31 is implemented by a differential amplifier, it may be configured that the input node 31a, the input node 31b, the output node 31p, and the output node 31n become the non-inverting input node, the inverting input node, the non-inverting output node, and the inverting output node, respectively, a first feedback resistor (not illustrated) is electrically connected between the non-inverting output node and the inverting input node, and a second feedback resistor (not illustrated) is electrically connected between the inverting output node and the non-inverting input node. The reference voltage generating circuit 31 outputs the reference voltage φVRH from the output node 31p to the comparator 21 and the reference voltage φVRL from the output node 31n to the comparator 21 in accordance with the difference between the control signals supplied to the input node 31a and the input node 31b. The reference voltage φVRH has a positive potential level VREFH (see FIG. 2A). The reference voltage φVRL has a negative potential level VREFL (≈−VREFH, see FIG. 2A).

The reference voltage generating circuit 32 includes an input node 32a, an input node 32b, an output node 32p, and an output node 32n. The reference voltage generating circuit 32 may be implemented by a differential amplifier. When the reference voltage generating circuit 32 is implemented by a differential amplifier, it may be configured that the input node 32a, the input node 32b, the output node 32p, and the output node 32n become the non-inverting input node, the inverting input node, the non-inverting output node, and the inverting output node, respectively, a first feedback resistor (not illustrated) is electrically connected between the non-inverting output node and the inverting input node, and a second feedback resistor (not illustrated) is electrically connected between the inverting output node and the non-inverting input node. The reference voltage generating circuit 32 outputs the reference voltage φV$_{R01}$ from the output node 32p to the comparator 22 and the reference voltage φV$_{R02}$ from the output node 32n to the comparator 22 in accordance with the difference between the control signals supplied to the input node 32a and the input node 32b. The reference voltage φV$_{R01}$ has a value between the reference voltage φV$_{RH}$ and the reference voltage φV$_{RL}$ and has a potential level V$_{REF0}$ (≈0, see FIG. 2B). The reference voltage φV$_{R02}$ has a potential level V$_{REF0}$ (≈0, see FIG. 2B). The potential level V$_{REF0}$ is a potential level between the potential level V$_{REFH}$ and the potential level V$_{REFL}$. That is, the reference voltage φV$_{R01}$ and the reference voltage φV$_{R02}$ are at substantially the same potential level.

In the sampler 2, the signal line L$_P$ is disposed among the AFE 4 (see FIG. 1), the comparator 21, and the comparator 22. One end of the signal line L$_P$ is electrically connected to the AFE 4 and the other end thereof is electrically connected to the comparator 21 and the comparator 22. The signal line L$_P$ transmits the differential P-side signal.

The signal line LN is disposed between the AFE 4 (see FIG. 1), the comparator 21, and the comparator 22. One end of the signal line L$_N$ is electrically connected to the AFE 4, and the other end thereof is electrically connected to the comparator 21 and the comparator 22. The signal line L$_N$ transmits the differential P-side signal. The signal line L$_P$ and the signal line L$_N$ constitute a differential pair.

The comparator 21 is connected to the signal lines L$_P$ and L$_N$, the reference voltage generating circuit 31, and the signal lines L$_{AP}$ and L$_{AN}$. The comparator 21 has the configuration of a differential input and differential output type. The comparator 21 functions as a comparator for amplitude absolute value determination. For this reason, the comparator 21 is designed to have a connection configuration on the input side with respect to the signal lines L$_P$ and L$_N$ and the reference voltage generating circuit 31. On the input side of the comparator 21, one of the two signal input nodes is connected to the signal line and the other is connected to the reference voltage generating circuit, and one of the two reference input nodes is connected to the signal line and the other is connected to the reference voltage generating circuit.

The comparator 21 includes a signal input node 21a, a signal input node 21b, a reference input node 21c, a reference input node 21d, a clock input node 21e, an output node 21p, and an output node 21n.

The signal input node 21a is electrically connected to the signal line L$_P$. The signal input node 21a receives the differential signal φD$_P$ on the P side via the signal line L$_P$.

The signal input node 21b is electrically connected to the output node 31p of the reference voltage generating circuit 31. The signal input node 21b receives the reference voltage φV$_{RH}$ from the output node 31p of the reference voltage generating circuit 31.

The reference input node 21c is electrically connected to the signal line L$_N$. The reference input node 21c receives the N-side differential signal φD$_N$ via the signal line L$_N$.

The reference input node 21d is electrically connected to the output node 31n of the reference voltage generating circuit 31. The reference input node 21d receives the reference voltage φV$_{RL}$ from the output node 31n of the reference voltage generating circuit 31.

The clock input node 21e is electrically connected to the node on the output side of the CDR 202 (see FIG. 1). The clock input node 21e receives the clock φCK from the CDR 202.

The output node 21p is electrically connected to the signal line L$_{AP}$. The output node 21p outputs the amplitude signal φV$_{AP}$ on the P side via the signal line L$_{AP}$.

The output node 21n is electrically connected to the signal line L$_{AN}$. The output node 21n outputs the amplitude signal φV$_{AN}$ on the N side via the signal line L$_{AN}$. The signal line L$_{AP}$ and the signal line L$_{AN}$ constitute a differential pair.

Figure 4:
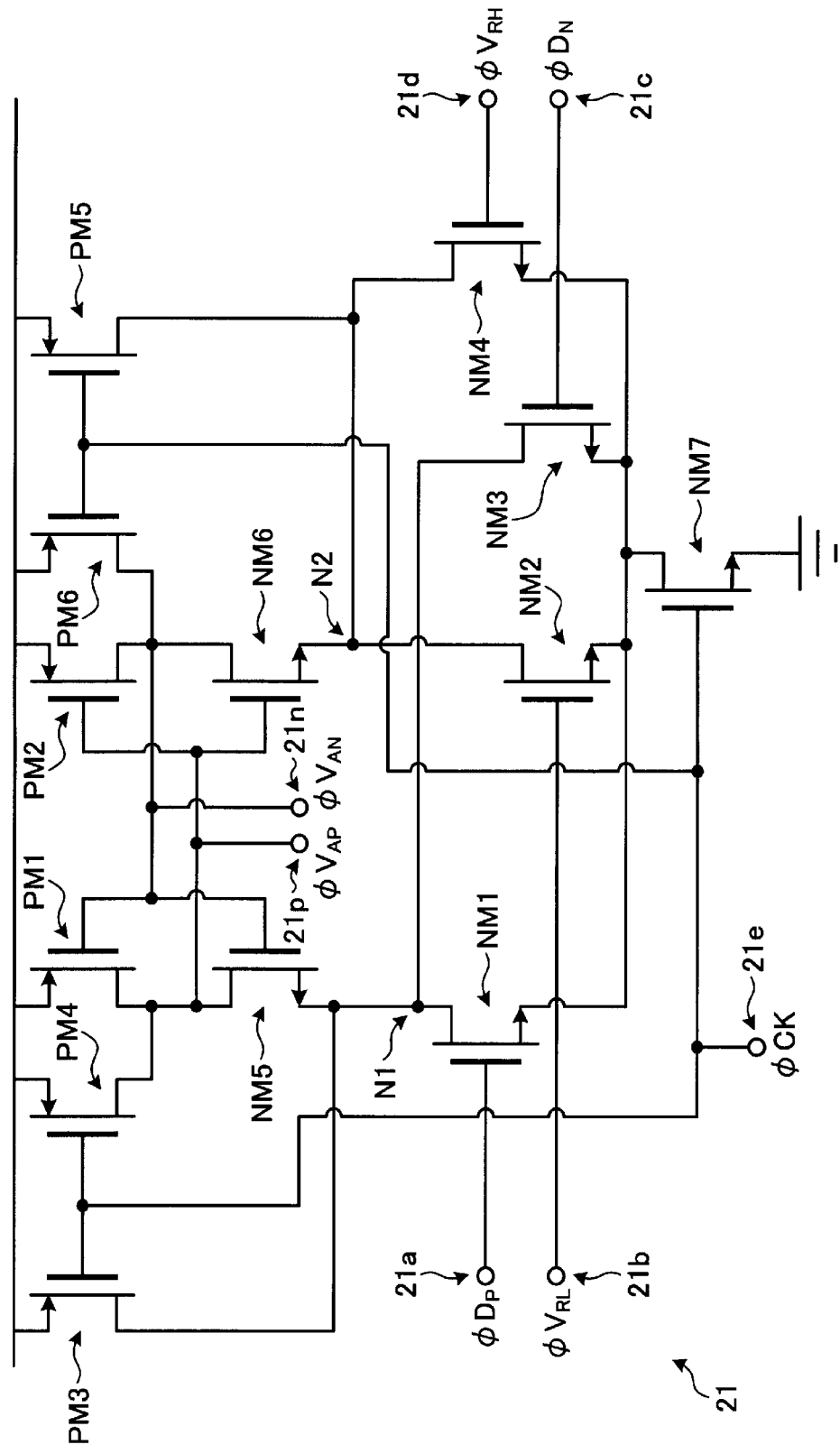
FIG. 4 is a circuit diagram illustrating a configuration of a comparator that determines an amplitude absolute value in the embodiment.

For example, the comparator 21 may be configured as illustrated in FIG. 4. FIG. 4 is a circuit diagram illustrating the configuration of the comparator 21 that determines the amplitude absolute value.

The comparator 21 includes NMOS transistors NM1, NM2, NM3, NM4, NM5, NM6, and NM7 and PMOS transistors PM1, PM2, PM3, PM4, PM5, and PM6.

In the NMOS transistor NM1, a gate is electrically connected to the signal input node 21a, a drain is electrically connected to a node N1, and a source is electrically connected to the drain of the NMOS transistor NM7. The differential signal φD$_P$ is input to the gate of the NMOS transistor NM1.

In the NMOS transistor NM2, the gate is electrically connected to the signal input node 21b, the drain is electrically connected to a node N2, and the source is electrically connected to the drain of the NMOS transistor NM7. The reference voltage φV$_{RL}$ is input to the gate of NMOS transistor NM2.

In the NMOS transistor NM3, the gate is electrically connected to the reference input node 21c, the drain is electrically connected to the node N1, and the source is electrically connected to the drain of the NMOS transistor NM7. The differential signal φD$_N$ is input to the gate of NMOS transistor NM3.

In the NMOS transistor NM4, the gate is electrically connected to the reference input node 21d, the drain is electrically connected to the node N2, and the source is electrically connected to the drain of the NMOS transistor NM7. The reference voltage φV$_{RH}$ is input to the gate of NMOS transistor NM4.

In the NMOS transistor NM5, the gate is electrically connected to the output node 21n, the drain is electrically connected to the output node 21p, and the source is electrically connected to the node N1.

In the NMOS transistor NM6, the gate is electrically connected to the output node 21p, the drain is electrically connected to the output node 21n, and the source is electrically connected to the drain of the node N2.

In the NMOS transistor NM7, the gate is electrically connected to the clock node 21e, the drain is electrically connected to each of the sources of the NMOS transistors NM1, NM2, NM3, and NM4, and the source is electrically connected to a node which becomes a ground potential. The clock φCK is input to the gate of the NMOS transistor NM7.

In the PMOS transistor PM1, the gate is electrically connected to the output node 21n, the drain is electrically connected to the output node 21p, and the source is electrically connected to a node which becomes a power source potential.

In the PMOS transistor PM2, the gate is electrically connected to the output node 21p, the drain is electrically connected to the output node 21n, and the source is electrically connected to a node which becomes a power source potential.

In the PMOS transistor PM3, the gate is electrically connected to the clock node 21e, the drain is electrically connected to the node N1, and the source is electrically connected to a node which becomes a power source potential. The clock φCK is input to the gate of the PMOS transistor PM3.

In the PMOS transistor PM4, the gate is electrically connected to the clock node 21e, the drain is electrically connected to the output node 21p, and the source is electrically connected to a node which becomes a power source potential. The clock φCK is input to the gate of the PMOS transistor PM4.

In the PMOS transistor PM5, the gate is electrically connected to the clock node 21e, the drain is electrically connected to the node N2, and the source is electrically connected to a node which becomes a power source potential. The clock φCK is input to the gate of the PMOS transistor PM5.

In the PMOS transistor PM6, the gate is electrically connected to the clock node 21e, the drain is electrically connected to the output node 21n, and the source is electrically connected to a node which becomes a power source potential. The clock φCK is input to the gate of the PMOS transistor PM6.

Referring back to FIG. 3, the comparator 22 is connected to the signal lines $L_P$ and $L_N$, the reference voltage generating circuit 32, and the signal lines $L_{PP}$ and $L_{PN}$. The comparator 22 has the configuration of a differential input and differential output type. The comparator 22 functions as a comparator that determines the polarity. The comparator 22 includes a signal input node 22a, a signal input node 22b, a reference input node 22c, a reference input node 22d, a clock input node 22e, an output node 22p, and an output node 22n.

The signal input node 22a is electrically connected to the signal line $L_P$. The signal input node 22a receives the differential signal $\varphi D_P$ on the P side via the signal line $L_P$.

The signal input node 22b is electrically connected to the signal line $L_N$. The signal input node 22b receives the differential signal φDN on the N side via the signal line $L_N$.

The reference input node 22c is electrically connected to the output node 32p of the reference voltage generating circuit 32. The reference input node 22c receives the reference voltage $\varphi V_{RO1}$ from the output node 32p of the reference voltage generating circuit 32.

The reference input node 22d is electrically connected to the output node 32n of the reference voltage generating circuit 32. The reference input node 22d receives the reference voltage $\varphi V_{RO2}$ from the output node 32n of the reference voltage generating circuit 32.

The clock input node 22e is electrically connected to the node on the output side of the CDR 202 (see FIG. 1). The clock input node 22e receives the clock φCK from the CDR 202.

The output node 22p is electrically connected to the signal line $L_{PP}$. The output node 22p outputs the amplitude signal $\varphi V_{PP}$ on the P side via the signal line $L_{PP}$.

The output node 22n is electrically connected to the signal line $L_N$. The output node 22n outputs the amplitude signal $\varphi V_{PN}$ on the N side via the signal line $L_N$. The signal line $L_{PP}$ and the signal line $L_{PN}$ constitute a differential pair.

Figure 5:
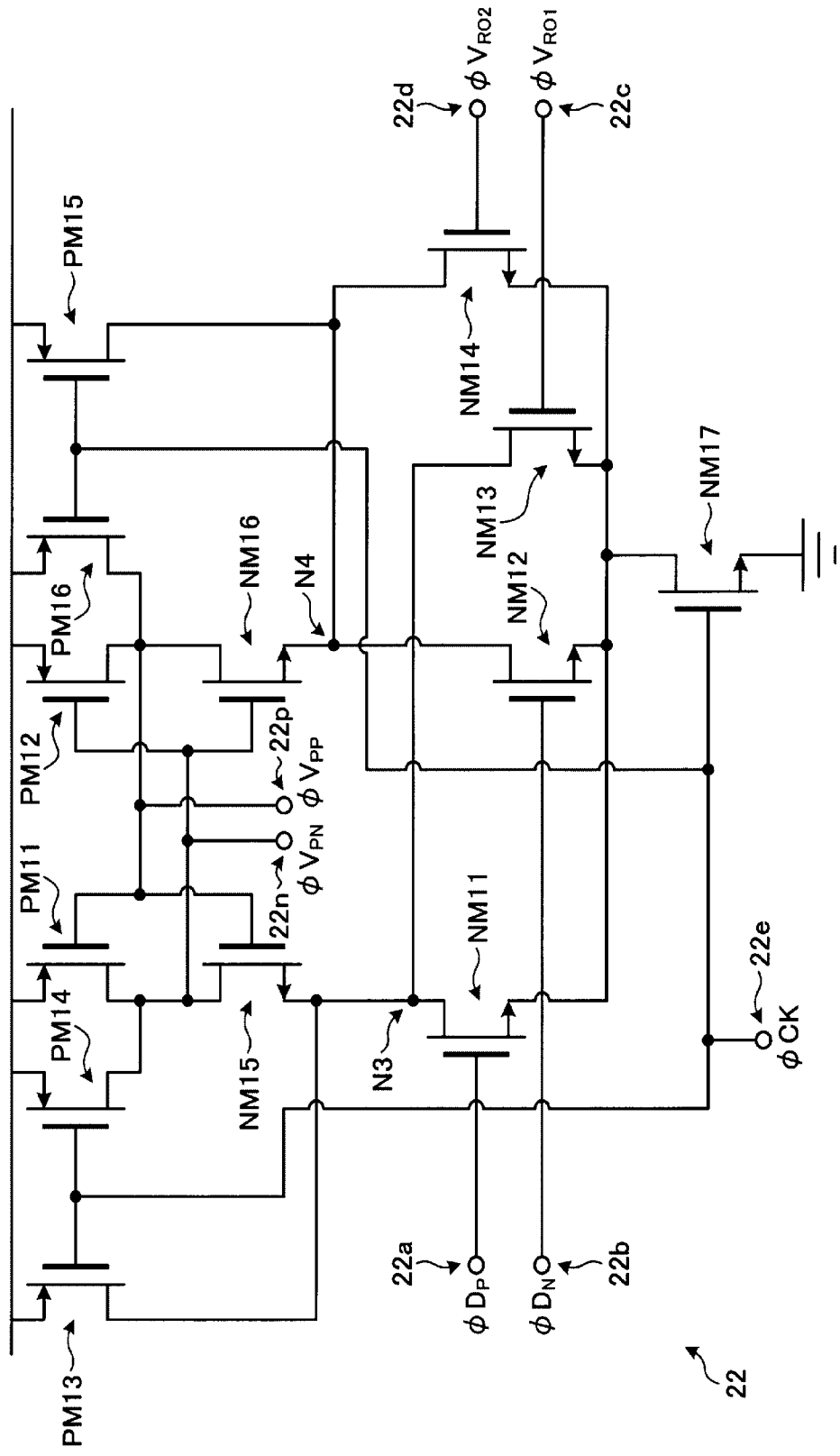
FIG. 5 is a circuit diagram illustrating a configuration of a comparator that determines polarity in the embodiment.

For example, the comparator 22 may be configured as illustrated in FIG. 5. FIG. 5 is a circuit diagram illustrating the configuration of the comparator 22 that determines polarity.

The comparator 22 includes NMOS transistors NM11, NM12, NM13, NM14, NM15, NM16, and NM17 and PMOS transistors PM11, PM12, PM13, PM14, PM15, and PM16.

In the NMOS transistor NM11, a gate is electrically connected to the signal input node 22a, a drain is electrically connected to the node N3, and a source is electrically connected to the drain of the NMOS transistor NM17. The differential signal φDP is input to the gate of the NMOS transistor NM11.

In the NMOS transistor NM12, the gate is electrically connected to the signal input node 22b, the drain is electrically connected to the node N4, and the source is electrically connected to the drain of the NMOS transistor NM17. The differential signal $\varphi D_N$ is input to the gate of the NMOS transistor NM12.

In the NMOS transistor NM13, the gate is electrically connected to the reference input node 22c, the drain is electrically connected to the node N3, and the source is electrically connected to the drain of the NMOS transistor NM17. The reference voltage $\varphi V_{RO1}$ is input to the gate of the NMOS transistor NM13.

In the NMOS transistor NM14, the gate is electrically connected to the reference input node 22d, the drain is electrically connected to the node N4, and the source is electrically connected to the drain of the NMOS transistor NM17. The reference voltage $\varphi V_{RO2}$ is input to the gate of NMOS transistor NM14.

In the NMOS transistor NM15, the gate is electrically connected to the output node 22p, the drain is electrically connected to the output node 22n, and the source is electrically connected to the node N3.

In the NMOS transistor NM16, the gate is electrically connected to the output node 22n, the drain is electrically connected to the output node 22p, and the source is electrically connected to the node N4.

In the NMOS transistor NM17, the gate is electrically connected to the clock node 22e, the drain is electrically connected to each of the sources of the NMOS transistors NM11, NM12, NM13, and NM14, and the source is electrically connected to a node which becomes a ground potential. The clock φCK is input to the gate of the NMOS transistor NM17.

In the PMOS transistor PM11, the gate is electrically connected to the output node 22p, the drain is electrically connected to the output node 22n, and the source is electrically connected to a node which becomes a power supply potential.

In the PMOS transistor PM12, the gate is electrically connected to the output node 22n, the drain is electrically connected to the output node 22p, and the source is electrically connected to a node which becomes a power supply potential.

In the PMOS transistor PM13, the gate is electrically connected to the clock node 22e, the drain is electrically connected to the node N3, and the source is electrically connected to a node which becomes a power supply potential. The clock φCK is input to the gate of the PMOS transistor PM13.

In the PMOS transistor PM14, the gate is electrically connected to the clock node 22e, the drain is electrically connected to the output node 22n, and the source is electrically connected to a node which becomes a power supply potential. The clock φCK is input to the gate of the PMOS transistor PM14.

In the PMOS transistor PM15, the gate is electrically connected to the clock node 22e, the drain is electrically connected to the node N4, and the source is electrically connected to a node which becomes a power supply potential. The clock φCK is input to the gate of the PMOS transistor PM15.

In the PMOS transistor PM16, the gate is electrically connected to the clock node 22e, the drain is electrically connected to the output node 22p, and the source is electrically connected to a node which becomes a power supply potential. The clock φCK is input to the gate of the PMOS transistor PM16.

Figures 6, 7:
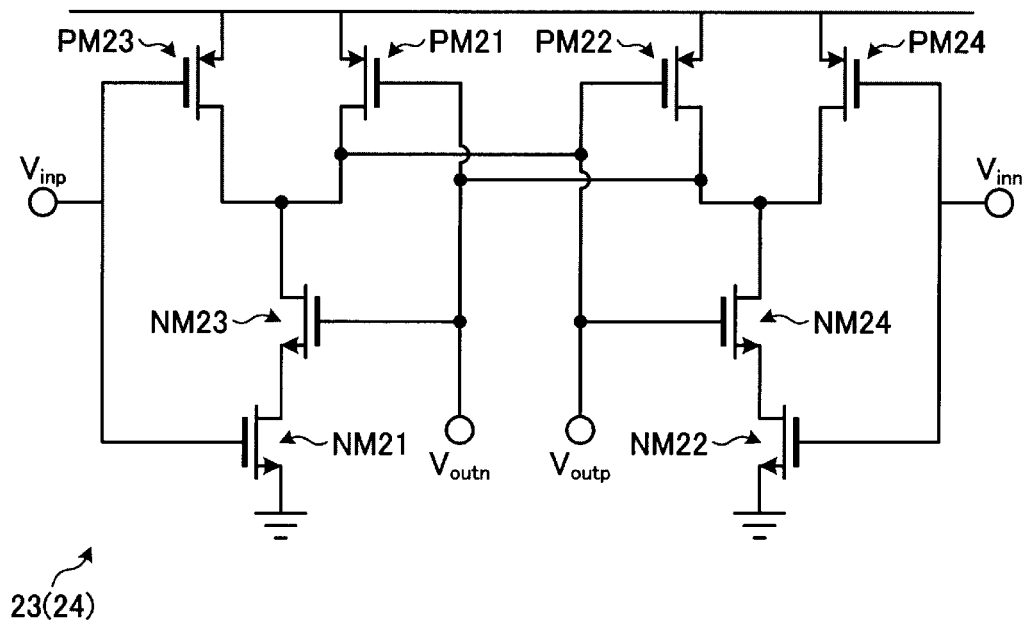
FIG. 6 is a circuit diagram illustrating a configuration of an SR latch in the embodiment.
FIG. 7 is a table illustrating a logic of a sampler in the embodiment.

For example, the SR latch 23 may be configured as illustrated in FIG. 6. FIG. 6 is a circuit diagram illustrating the configuration example of the SR latch 23. Although the configuration of the SR latch 23 will be described as an example, the configuration of the SR latch 24 is the same as that of the SR latch 23.

The SR latch 23 includes NMOS transistors NM21, NM22, NM23, and NM24 and PMOS transistors PM21, PM22, PM23, and PM24.

In the NMOS transistor NM21, a gate is electrically connected to a set input node Vinp, a drain is electrically connected to the source of the NMOS transistor NM23, and a source is electrically connected to a node which becomes a ground potential.

In the NMOS transistor NM22, the gate is electrically connected to a set input node Vinn, the drain is electrically connected to the source of the NMOS transistor NM24, and the source is electrically connected to a node which becomes a ground potential.

In the NMOS transistor NM23, the gate is electrically connected to an output node Voutn on the N side, the drain is electrically connected to an output node Voutp on the P side, and the source is electrically connected to the drain of the NMOS transistor NM21.

In the NMOS transistor NM24, the gate is electrically connected to an output node Voutp on the P side, the drain is electrically connected to an output node Voutn on the N side, and the source is electrically connected to the drain of the NMOS transistor NM22.

In the PMOS transistor PM21, the gate is electrically connected to an output node Voutn on the N side, the drain is electrically connected to an output node Voutp on the P side, and the source is electrically connected to a node which becomes a power source potential.

In the PMOS transistor PM22, the gate is electrically connected to an output node Voutp on the P side, the drain is electrically connected to an output node Voutn on the N side, and the source is electrically connected to a node which becomes a power source potential.

In the PMOS transistor PM23, the gate is electrically connected to the set input node Vinp, the drain is electrically connected to the output node Voutp on the P side, and the source is electrically connected to a node which becomes a power source potential.

In the PMOS transistor PM24, the gate is electrically connected to the reset input node Vinn, the drain is electrically connected to the output node Voutn on the N side, and the source is electrically connected to a node which becomes a power source potential.

For example, φDP=V1 and φDN=LV4 in a period TP1 illustrated in FIG. 2A. In the configuration illustrated in FIG. 5, Gate voltage of NM11<gate voltage of NM13≈gate voltage of NM14<gate voltage of NM12, and On resistance of NM12<on resistance of NM13≈on resistance of NM14<on resistance of NM11.

The node N4 is pulled down to the level L faster than the node N3. As a result, since the nodes N3 and N4 are at the level H and the level L, respectively, and the sources of the NMOS transistors NM15 and NM16 are at the H level and the L level, respectively, the potentials of the output nodes 22n and 22p become the H level and the L level, respectively. That is, the comparator outputs the polarity signal φV$_P$=(φV$_{PP}$−φV$_{PN}$)=(level L−level H)="0" as the polarity determination result indicating that the polarity is (φD$_P$, φD$_N$)=(−,+).

Further, in the configuration illustrated in FIG. 4, Gate voltage of NM1<gate voltage of NM2<gate voltage of NM4<gate voltage of NM3, and On resistance of NM3<on resistance of NM4<on resistance of NM2<on resistance of NM1.

The node N1 is pulled down to the level L faster than the node N2. As a result, since the nodes N1 and N2 are at the level L and the level H, respectively, and the sources of the NMOS transistors NM5 and NM6 are at the L level and the H level, respectively, the potentials of the output nodes 21n and 21p become the L level and the H level, respectively. That is, the comparator outputs the amplitude signal φV$_A$=(φV$_{AP}$−φV$_{AN}$)=(level H−level L)="1" as the amplitude absolute value determination result indicating that the amplitude absolute value is larger than V$_{REFH}$.

That is, the sampler 2 may output (polarity signal φV$_P$, amplitude signal φV$_A$)=(0,1) as the result of identification of the data value 0, as illustrated in FIG. 7. FIG. 7 is a diagram illustrating the operation of the sampler 2.

For example, φD$_P$=LV4 and φD$_N$=LV1 in a period TP2 illustrated in FIG. 2A. In the configuration illustrated in FIG. 5, Gate voltage of NM12<gate voltage of NM13=gate voltage of NM14<gate voltage of NM11, and On resistance of NM11<on resistance of NM13≈on resistance of NM14<on resistance of NM12.

The node N3 is pulled down to the level L faster than the node N4. As a result, since the nodes N3 and N4 are at the level L and the level H, respectively, and the sources of the NMOS transistors NM15 and NM16 are at the L level and the H level, respectively, the potentials of the output nodes 22n and 22p become the L level and the H level, respectively. That is, the comparator outputs the polarity signal φV$_P$=(φV$_{PP}$−φV$_{PN}$)=(level H−level L)="1" as the polarity determination result indicating that the polarity is (φD$_P$, φD$_N$)=(+,−).

Further, in the configuration illustrated in FIG. 4, Gate voltage of NM3<gate voltage of NM2<gate voltage of NM4<gate voltage of NM1, and On resistance of NM1<on resistance of NM4<on resistance of NM2<on resistance of NM3. The node N1 is pulled down to the level L faster than the node N2. As a result, since the nodes N1 and N2 are at the level L and the level H, respectively, and the sources of the NMOS transistors NM5 and NM6 are at the L level and the H level, respectively, the potentials of the output nodes 21n and 21p become the L level and the H level, respectively. That is, the comparator outputs the amplitude signal φV$_A$=(φV$_{AP}$−φV$_{AN}$)=(level H-level L)="1" as the amplitude absolute value determination result indicating that the amplitude absolute value is larger than $V_{REFH}$.

That is, the sampler 2 may output (polarity signal φ$V_P$, amplitude signal φ$V_A$)=(1,1) as the result of identification of the data value 3, as illustrated in FIG. 7.

For example, φ$D_P$=LV2 and φ$D_N$=LV3 in a period TP3 illustrated in FIG. 2A. In the configuration illustrated in FIG. 5, Gate voltage of NM11<gate voltage of NM13≈gate voltage of NM14<gate voltage of NM12, and On resistance of NM12<on resistance of NM13≈on resistance of NM14<on resistance of NM11. The node N4 is pulled down to the level L faster than the node N3. As a result, since the nodes N3 and N4 are at the level H and the level L, respectively, and the sources of the NMOS transistors NM15 and NM16 are at the H level and the L level, respectively, the potentials of the output nodes 22n and 22p become the H level and the L level, respectively. That is, the comparator outputs the polarity signal φ$V_P$=(φ$V_{PP}$−φ$V_N$)= (level L−level H)="0" as the polarity determination result indicating that the polarity is (φ$D_P$, φ$D_N$)=(−,+).

Further, in the configuration illustrated in FIG. 4,

Gate voltage of NM2<gate voltage of NM1<gate voltage of NM3<gate voltage of NM4, and On resistance of NM4<on resistance of NM3<on resistance of NM1<on resistance of NM2. The node N2 is pulled down to the level L faster than the node N1. As a result, since the nodes N1 and N2 are at the level H and the level L, respectively, and the sources of the NMOS transistors NM5 and NM6 are at the H level and the L level, respectively, the potentials of the output nodes 21n and 21p become the H level and the L level, respectively. That is, the comparator outputs the amplitude signal φ$V_A$=(φ$V_{AP}$−φ$V_{AN}$)=(level L−level H)="0" as the amplitude absolute value determination result indicating that the amplitude absolute value is smaller than $V_{REFH}$.

That is, the sampler 2 may equivalently output the result of identification of the data value 1 by outputting (polarity signal φ$V_P$, amplitude signal φ$V_A$)=(0,0), as illustrated in FIG. 7.

For example, φ$D_P$=LV3 and φ$D_N$=LV2 in a period TP4 illustrated in FIG. 2A. In the configuration illustrated in FIG. 5, Gate voltage of NM12<gate voltage of NM13≈gate voltage of NM14<gate voltage of NM11, and On resistance of NM11<on resistance of NM13≈on resistance of NM14<on resistance of NM12.

The node N3 is pulled down to the level L faster than the node N4. As a result, since the nodes N3 and N4 are at the level L and the level H, respectively, and the sources of the NMOS transistors NM15 and NM16 are at the L level and the H level, respectively, the potentials of the output nodes 22n and 22p become the L level and the H level, respectively. That is, the comparator outputs the polarity signal φ$V_P$=(φ$V_{PP}$−φ$V_{PN}$)=(level H−level L)="1" as the polarity determination result indicating that the polarity is (φ$D_P$, φ$D_N$)=(+,−).

Further, in the configuration illustrated in FIG. 4,

Gate voltage of NM2<gate voltage of NM3<gate voltage of NM1<gate voltage of NM4, and On resistance of NM4<on resistance of NM1<on resistance of NM3<on resistance of NM2.

The node N2 is pulled down to the level L faster than the node N1. As a result, since the nodes N1 and N2 are at the level H and the level L, respectively, and the sources of the NMOS transistors NM5 and NM6 are at the H level and the L level, respectively, the potentials of the output nodes 21n and 21p become the H level and the L level, respectively. That is, the comparator outputs the amplitude signal $V_A$=(φ$V_{AP}$−φVAN)=(level L−level H)="0" as the amplitude absolute value determination result indicating that the amplitude absolute value is smaller than $V_{REFH}$.

That is, the sampler 2 may output (polarity signal φ$V_P$, amplitude signal φ$V_A$)=(1,0) as the result of identification of the data value 2, as illustrated in FIG. 7.

As described above, according to the present embodiment, the sampler 2 is configured in the semiconductor integrated circuit 1 using the comparator for polarity determination and the comparator for amplitude absolute value determination. Since the number of comparators used in the sampler operation may be reduced, the number of wirings connected in parallel from the AFE 4 to the comparator can be reduced, the amount of charges needed to charge wiring can be suppressed to more smaller amount, and the driving load of the AFE 4 (driving load of a driver 4f) may be reduced. In addition, since the number of comparators operating in the sampler 2 itself decreases, the power used therein can be reduced. As a result, power consumption in the semiconductor integrated circuit 1 can be easily reduced.

In the sampler 2, the comparator 21 and the comparator 22 may include the same circuit configuration.

Alternatively, on the input side of the comparator 21, the signal input node 21a may be connected to the output node 31n of the reference voltage generating circuit 31, the signal input node 21b may be connected to the signal line $L_N$, the reference input node 21c may be connected to the output node 31p of the reference voltage generating circuit 31, and the reference input node 21d may be connected to the signal line $L_P$.

Figure 8:
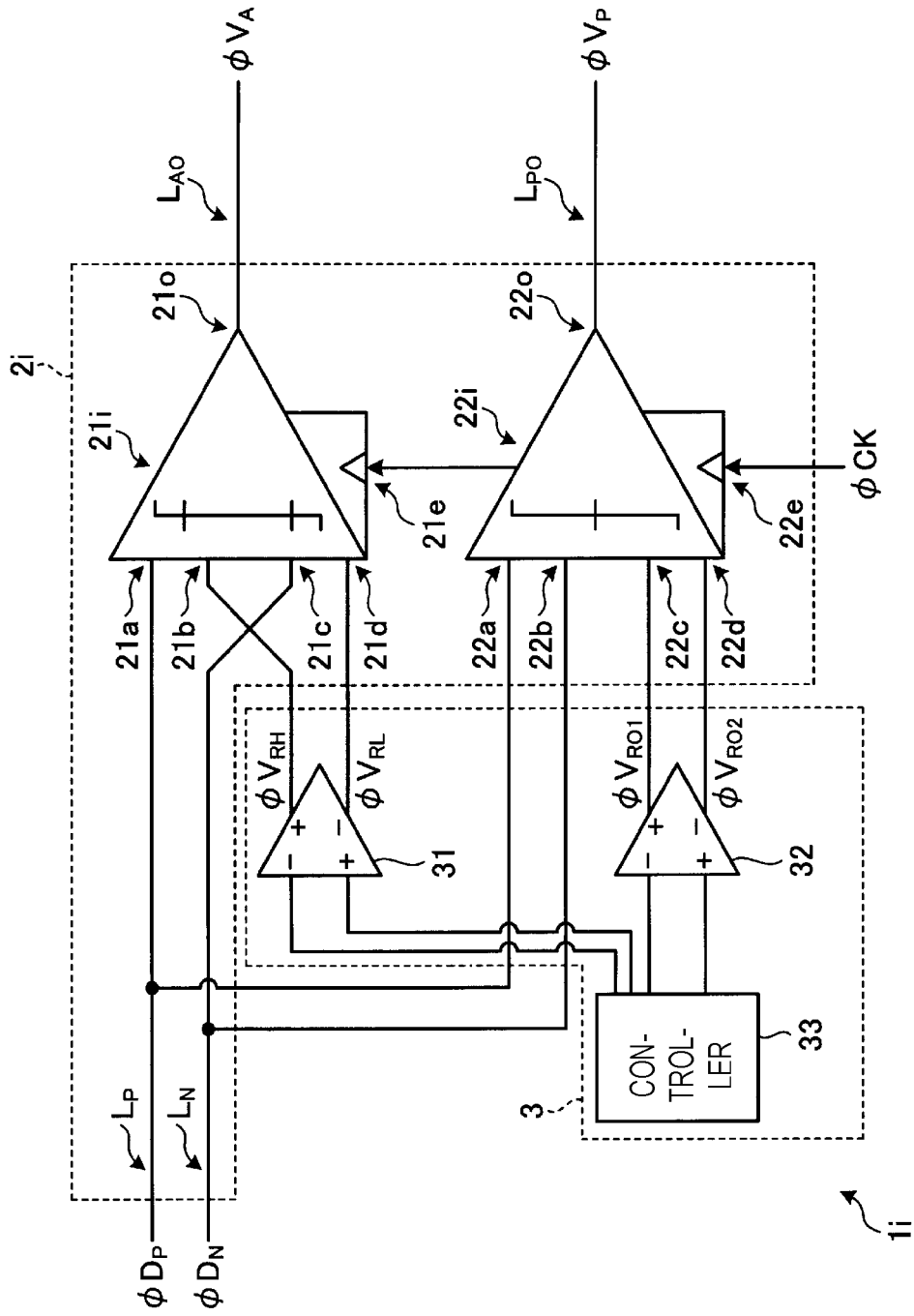
FIG. 8 is a diagram illustrating a configuration of a semiconductor integrated circuit according to a modification of the embodiment.

Alternatively, as illustrated in FIG. 8, in a sampler 2i of a semiconductor integrated circuit ii, a comparator 22i for polarity determination and a comparator 21i for amplitude absolute value determination may have the configuration of a differential input and single output type. FIG. 8 is a diagram illustrating the configuration of the sampler 2i according to a modification of the embodiment.

Specifically, the comparator 21i includes an output node 21o instead of the output node 21p and the output node 21n (see FIG. 3). The output node 21o is electrically connected to the output line $L_{AO}$. The output node 21o outputs the amplitude signal φVA via the output line $L_{AO}$.

Figure 9:
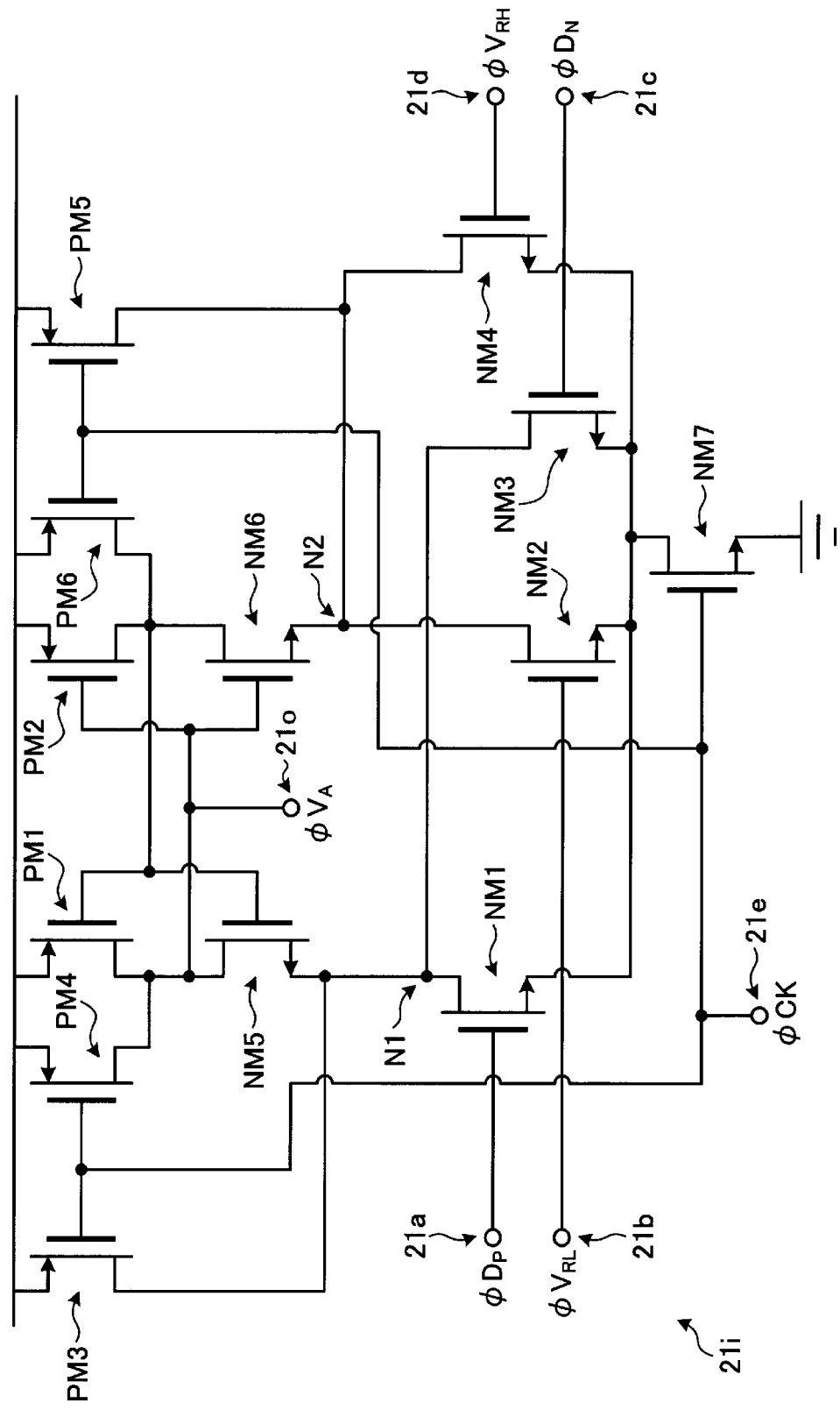
FIG. 9 is a diagram illustrating a configuration of a comparator that determines an amplitude absolute value in the modification of the embodiment.

The comparator 21i may be configured as illustrated in FIG. 9. FIG. 9 is a circuit diagram illustrating the configuration of the comparator 21i for amplitude absolute value determination in the modification of the embodiment. In the configuration illustrated in FIG. 4, the output node 21n on the N side is omitted and the output node 21p on the P side is left as the output node 21o, whereby the configuration illustrated in FIG. 9 is obtained. That is, the comparator 21i outputs a signal corresponding to the differential signal φ$V_{AP}$ on the P side as the amplitude signal φ$V_A$.

That is, when the amplitude absolute value of the differential signals φDP and φDN is larger than $V_{REFH}$, the comparator 21i outputs the amplitude signal φVA=(level H)="1," and when the amplitude absolute value of the differential signals φDP and φDN is smaller than $V_{REFH}$, the comparator 21i outputs the amplitude signal φVA=(level L)="0."

Further, as illustrated in FIG. 8, the comparator 21i includes an output node 22o instead of the output node 22p and the output node 22n (see FIG. 3). The output node 22o is electrically connected to the output line $L_{PO}$. The output node 220 outputs the polarity signal $\varphi V_P$ via the output line $L_{PO}$.

Figure 10:
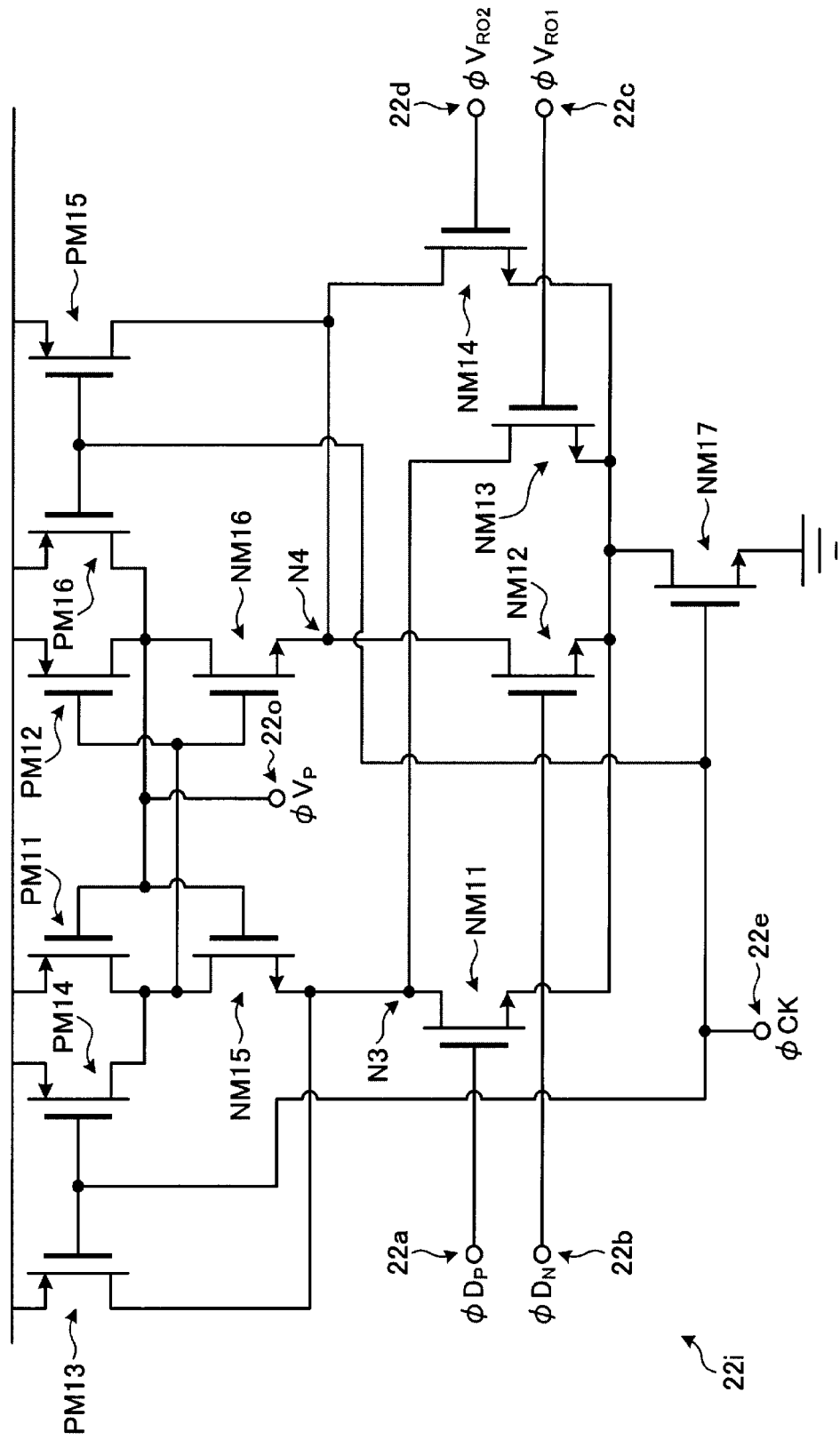
FIG. 10 is a diagram illustrating a configuration of a comparator that determines polarity in the modification of the embodiment.

The comparator 22i may be configured as illustrated in FIG. 10. FIG. 10 is a circuit diagram illustrating the configuration of the comparator 22i for polarity determination in the modification of the embodiment. In the configuration illustrated in FIG. 5, the output node 22n on the N side is omitted and the output node 21p on the P side is left as the output node 21o, whereby the configuration illustrated in FIG. 10 is obtained. That is, the comparator 22i outputs a signal corresponding to the differential signal $\varphi V_{PP}$ on the P side as the polarity signal $\varphi V_P$.

That is, when the polarity of the differential signals $\varphi D_P$ and $\varphi D_N$ is (+,−), the comparator 22i outputs the polarity signal $\varphi V_P$=(level H)="1," and when the polarity of the differential signals $\varphi D_P$ and $\varphi D_N$ is (−,+), the comparator 22i outputs the polarity signal $\varphi V_P$=(level L)="0."

Further, the sampler 2 is the same as that of the embodiment in that the identification result of the data value may be output by a combination of (a polarity signal, an amplitude signal), as illustrated in FIG. 7. The data values for the polarity signal and the amplitude signal illustrated in FIG. 7 are examples, and other data values may be taken within the range in which the number of comparators used in the sampler operation may be reduced.

The sampler 2i is configured in the semiconductor integrated circuit ii using the comparator 22i for polarity determination and the comparator 21i for amplitude absolute value determination. As a result, the number of comparators used in the sampler operation may be reduced and power consumption in the semiconductor integrated circuit ii may be easily reduced.

Figure 11:
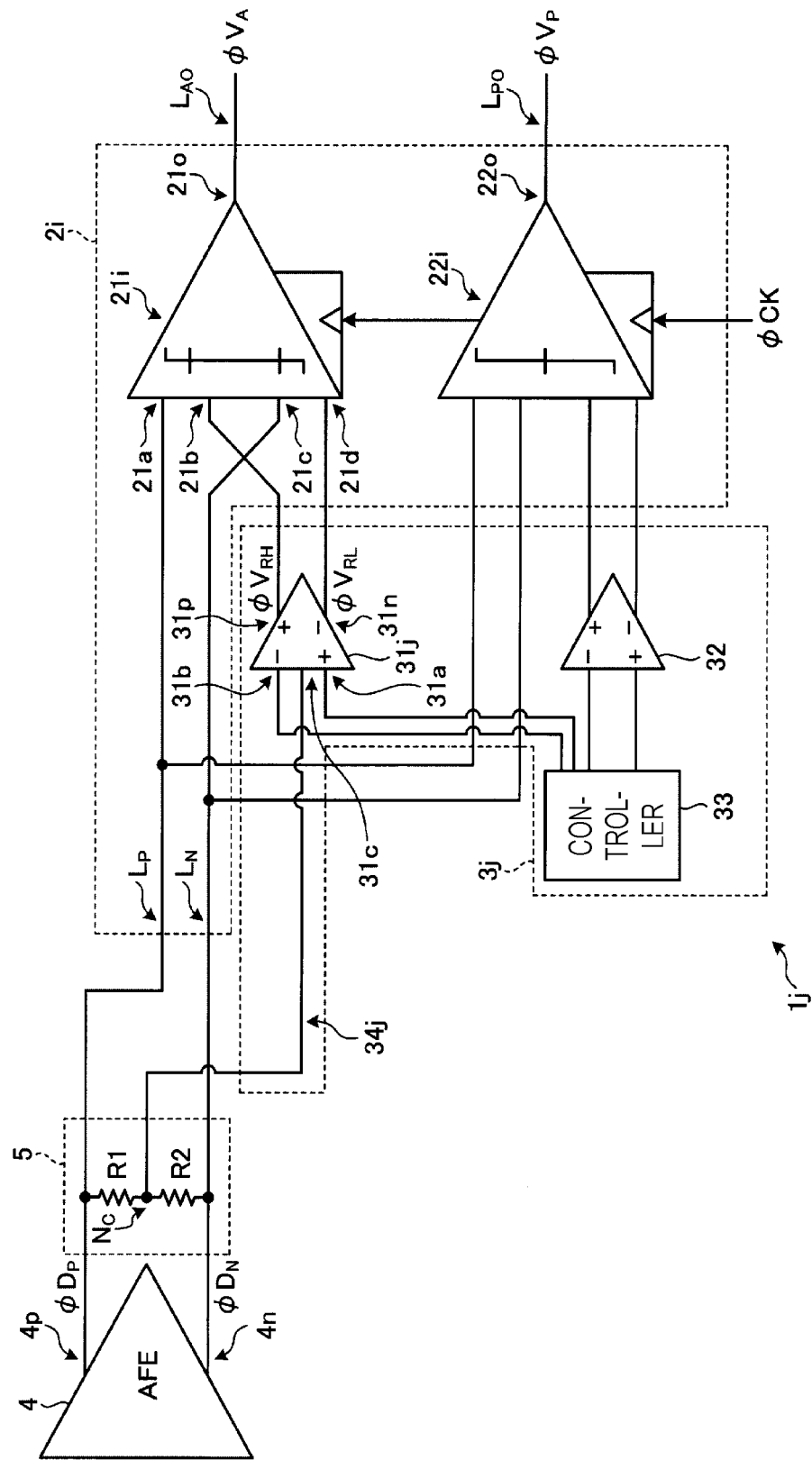
FIG. 11 is a diagram illustrating a configuration of a semiconductor integrated circuit according to another modification of the embodiment.

Alternatively, a design configured to reduce a common mode noise may be further added. For example, in the semiconductor integrated circuit 1j, a common voltage detecting circuit 5 capable of detecting the common mode voltage of the differential signals $\varphi D_P$ and $\varphi D_N$ may be configured for the signal lines $L_P$ and $P_N$ that constitute a differential pair, as illustrated in FIG. 11. FIG. 11 is a circuit diagram illustrating the configuration of the semiconductor integrated circuit 1j according to another modification of the embodiment.

The common voltage detecting circuit 5 may be electrically connected between the AFE 4 and the sampler 2i. The common voltage detecting circuit 5 includes a resistance element R1, a resistance element R2, and a common node Nc. One end of the resistance element R1 is electrically connected to the signal line $L_P$ and the other end thereof is electrically connected to the common node Nc. One end of the resistance element R2 is electrically connected to the signal line $L_N$ and the other end thereof is electrically connected to the common node Nc. When the resistor values of the resistance element R1 and the resistance element R2 are substantially equal to each other, the voltage of the common node Nc may be made substantially equal to the common mode voltage of the differential signals $\varphi D_P$ and $\varphi D_N$ by resistance division.

In the meantime, the control circuit 3j further includes a common mode line 34j. One end of the common mode line 34j is electrically connected to the common node Nc in the common voltage detecting circuit 5 and the other end thereof is electrically connected to a common mode terminal 31c of a reference voltage generating circuit (differential amplifier) 31j. The common mode terminal 31c is configured to add the voltage received from the common mode terminal 31c as an offset voltage, to the control signal received from the input node 31a and the control signal received from the input node 31b, respectively in the reference voltage generating circuit 31j.

Figure 12:
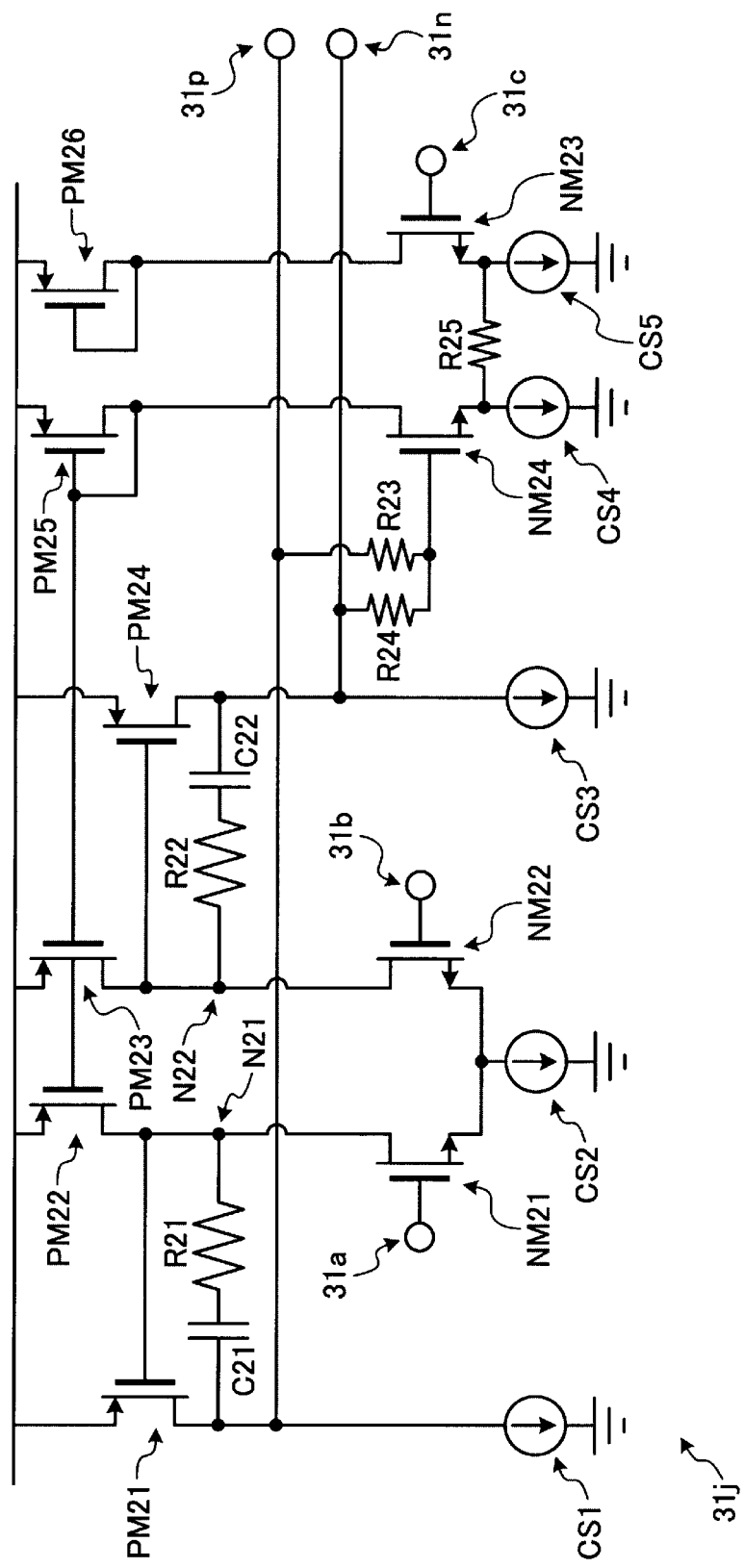
FIG. 12 is a diagram illustrating a configuration of a reference voltage generating circuit in said another modification of the embodiment.

For example, the reference voltage generating circuit 31j may be configured as illustrated in FIG. 12. FIG. 12 is a circuit diagram illustrating the configuration of the reference voltage generating circuit 31j.

The reference voltage generating circuit 31j includes NMOS transistors NM21, NM22, NM23, and NM24, PMOS transistors PM21, PM22, PM23, PM24, PM25, and PM26, resistance elements R21, R22, R23, R24, and R25, capacitors C21 and C22, and current sources CS1, CS2, CS3, CS4, and CS5.

In the NMOS transistor NM21, a gate is electrically connected to the input node 31a, a drain is electrically connected to the node N21, and a source is electrically connected to the node which becomes a ground potential via the current source CS1. A control signal from the controller 33 is input to the gate of the NMOS transistor NM21.

In the NMOS transistor NM22, the gate is electrically connected to the input node 31b, the drain is electrically connected to the node N22, and the source is electrically connected to the node which becomes a ground potential via the current source CS2. A control signal from the controller 33 is input to the gate of the NMOS transistor NM22.

In the NMOS transistor NM23, the gate is electrically connected to the common mode terminal 31c, the drain is electrically connected to the drain of the PMOS transistor PM26, and the source is electrically connected to one end of the current source CS5 and one end of the resistance element R25. The voltage detected by the common voltage detecting circuit 5 (≈common mode voltage) is input to the gate of the NMOS transistor NM23.

In the NMOS transistor NM24, the gate is electrically connected to one end of the resistance element R23 and one end of the resistance element R24, the drain is electrically connected to the drain of the PMOS transistor PM25, and the source is electrically connected to one end of the current source CS4 and the other end of the resistance element R25. The other end of the resistance element R23 is electrically connected to the output node 31p, and the other end of the resistance element R24 is electrically connected to the output node 31n.

In the PMOS transistor PM21, the gate is electrically connected to the node N21, the drain is electrically connected to the output node 31p, one end of the current source CS1, and one end of the capacitor C21, and the source is electrically connected to a node at which the source becomes a power source potential. The other end of the capacitor C21 is electrically connected to one end of the resistance element R21 and the other end of the resistance element R21 is electrically connected to the node N21.

In the PMOS transistor PM22, the gate is electrically connected to the gates of the PMOS transistors PM23 and PM25, the drain is electrically connected to the node N21, and the source is electrically connected to a node which becomes a power source potential.

In the PMOS transistor PM23, the gate is electrically connected to the gates of the PMOS transistors PM22 and PM25, the drain is electrically connected to the node N22, and the source is electrically connected to a node which becomes a power source potential.

In the PMOS transistor PM24, the gate is electrically connected to the node N22, the drain is electrically connected to the output node 31n, one end of the current source CS3, and one end of the capacitor C22, and the source is electrically connected to a node which becomes a power source potential. The other end of the capacitor C22 is electrically connected to one end of the resistance element R22 and the other end of the resistance element R22 is electrically connected to the node N22.

In the PMOS transistor PM25, the gate is electrically connected to the gates of the PMOS transistors PM22 and PM23 and the drain of the PMOS transistor PM25, the drain is electrically connected to the drain of the NMOS transistor NM24, and the source is electrically connected to a node which becomes a power source potential. The PMOS transistor PM25 constitutes a current mirror circuit together with the PMOS transistors PM22 and PM23.

In the PMOS transistor PM26, the gate is electrically connected to the drain of the PMOS transistor PM26, the drain is electrically connected to the drain of the NMOS transistor NM23, and the source is electrically connected to a node which becomes a power source potential.

In the reference voltage generating circuit 31j, the potentials of the nodes N21 and N22 are determined according to the input voltages of the input nodes 31a and 31b, respectively. The output voltage corresponding to the input voltage of the input node 31a appears on the output node 31p because the PMOS transistor PM21 causes a drain current to flow due to a gate voltage corresponding to the potential of the node N21 and the potential of the output node 31p changes. Output voltage corresponding to the input voltage of the input node 31b appears on the output node 31n because the PMOS transistor PM24 causes the drain current to flow because of the gate voltage corresponding to the potential of the node N22, and the potential of the output node 31n changes. At this time, the voltage corresponding to the input voltage to the common mode terminal 31c (common mode voltage) is transmitted in the order: the gate-source voltage of the NMOS transistor NM23→both end voltages of the resistance element R25→the gate-source voltage of the NMOS transistor NM24→both end voltages of the resistance elements R23 and R24. As a result, voltage corresponding to the common mode voltage appears on the output node 31p and the output node 31n, respectively.

According to the semiconductor integrated circuit 1j illustrated in FIG. 11, for example, when the common mode noise is mixed in the differential signals $\varphi D_P$ and $\varphi D_N$, each of the amplitudes of the differential signals $\varphi D_P$ and $\varphi D_N$ may vibrate by the common mode noise. At this time, the differential signal $\varphi D_P$ which the signal line $L_P$ transmits to the signal input node 21a, and the reference voltage $\varphi V_{RH}$ which the reference voltage generating circuit 31j transmits to the signal input node 21b may be caused to vibrate by the common mode noise so that the common mode noise may be canceled by the comparator 21. This allows the common mode noise to be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a pair of differential signal lines including a first signal line and a second signal line;
   a first comparator including:
      a first input node electrically connected to the first signal line;
      a second input node electrically connectable to a first reference terminal at a first reference voltage;
      a third input node electrically connected to the second signal line; and
      a fourth input node electrically connectable to a second reference terminal at a second reference voltage different from the first reference voltage, wherein
      the first comparator is configured to output at least one of a first signal corresponding to a difference between a potential of the first input node and a potential of the second input node, and a second signal corresponding to a difference between a potential of the third input node and a potential of the fourth input node; and
   a second comparator including:
      a fifth input node electrically connected to the first signal line;
      a sixth input node electrically connected to the second signal line;
      a seventh input node electrically connectable to a third reference terminal at a third reference voltage different from the first reference voltage and the second reference voltage; and
      an eighth input node electrically connectable to a fourth reference terminal at a fourth reference voltage different from the first reference voltage and the second reference voltage, wherein
      the second comparator is configured to output at least one of a third signal corresponding to a difference between a potential of the fifth input node and a potential of the seventh input node, and a fourth signal corresponding to a difference between a potential of the sixth input node and a potential of the eighth input node,
   wherein the third reference voltage is between the first reference voltage and the second reference voltage, the fourth reference voltage is between the first reference voltage and the second reference voltage, and the third reference voltage is equal to the fourth reference voltage.

2. The semiconductor integrated circuit according to claim 1, wherein the first comparator and the second comparator include a same circuit configuration.

3. The semiconductor integrated circuit according to claim 1, wherein the first comparator includes:
   a first NMOS transistor having a gate electrically connected to the first input node and a drain electrically connected to a first node;
   a second NMOS transistor having a gate electrically connected to the second input node and a drain electrically connected to a second node;
   a third NMOS transistor having a gate electrically connected to the third input node and a drain electrically connected to the first node; and
   a fourth NMOS transistor having a gate electrically connected to the fourth input node and a drain electrically connected to the second node.

4. The semiconductor integrated circuit according to claim 3, wherein the second comparator includes:
   a fifth NMOS transistor having a gate electrically connected to the fifth input node and a drain electrically connected to a third node;
   a sixth NMOS transistor having a gate electrically connected to the sixth input node and a drain electrically connected to a fourth node;

a seventh NMOS transistor having a gate electrically connected to the seventh input node and a drain electrically connected to the third node; and
an eighth NMOS transistor having a gate electrically connected to the eighth input node and a drain electrically connected to the fourth node.

5. The semiconductor integrated circuit according to claim 1, further comprising:
a first resistor including one end electrically connected to the first signal line and another end electrically connected to a common node;
a second resistor including one end electrically connected to the second signal line and another end electrically connected to the common node; and
a first reference voltage generating circuit including a first common input terminal electrically connected to the common node, the first reference terminal, and the second reference terminal.

6. The semiconductor integrated circuit according to claim 1, wherein the first comparator is configured to output both of the first signal and the second signal.

7. The semiconductor integrated circuit according to claim 6, wherein the second comparator is configured to output both of the third signal and the fourth signal.

8. The semiconductor integrated circuit according to claim 1, wherein a signal that is transferred on the pair of differential signal lines is a four-level pulse amplitude modulation (PAM4) signal.

9. A receiving device comprising:
a pair of differential receiving nodes connectable to a wired differential transmission path;
a pair of differential signal lines connected to the pair of differential receiving nodes, the pair of differential signal lines including a first signal line and a second signal line;
a first comparator including:
a first input node electrically connected to the first signal line;
a second input node electrically connectable to a first reference terminal at a first reference voltage;
a third input node electrically connected to the second signal line; and
a fourth input node electrically connectable to a second reference terminal at a second reference voltage different from the first reference voltage, wherein
the first comparator is configured to output at least one of a first signal corresponding to a difference between a potential of the first input node and a potential of the second input node, and a second signal corresponding to a difference between a potential of the third input node and a potential of the fourth input node;
a second comparator including:
a fifth input node electrically connected to the first signal line;
a sixth input node electrically connected to the second signal line;
a seventh input node electrically connectable to a third reference terminal at a third reference voltage different from the first reference voltage and the second reference voltage; and
an eighth input node electrically connectable to a fourth reference terminal at a fourth reference voltage different from the first reference voltage and the second reference voltage, wherein
the second comparator is configured to output at least one of a third signal corresponding to a difference between a potential of the fifth input node and a potential of the seventh input node, and a fourth signal corresponding to a difference between a potential of the sixth input node and a potential of the eighth input node; and
an internal circuit configured to restore a value indicated by a differential signal received by the pair of differential receiving nodes based on the at least one of the first and second signals and the at least one of the third and fourth signal,
wherein the third reference voltage is between the first reference voltage and the second reference voltage, the fourth reference voltage is between the first reference voltage and the second reference voltage, and the third reference voltage is equal to the fourth reference voltage.

10. The receiving device according to claim 9, wherein the first comparator and the second comparator include a same circuit configuration.

11. The receiving device according to claim 9, wherein the first comparator includes:
a first NMOS transistor having a gate electrically connected to the first input node and a drain electrically connected to a first node;
a second NMOS transistor having a gate electrically connected to the second input node and a drain electrically connected to a second node;
a third NMOS transistor having a gate electrically connected to the third input node and a drain electrically connected to the first node; and
a fourth NMOS transistor having a gate electrically connected to the fourth input node and a drain electrically connected to the second node.

12. The receiving device according to claim 11, wherein the second comparator includes:
a fifth NMOS transistor having a gate electrically connected to the fifth input node and a drain electrically connected to a third node;
a sixth NMOS transistor having a gate electrically connected to the sixth input node and a drain electrically connected to a fourth node;
a seventh NMOS transistor having a gate electrically connected to the seventh input node and a drain electrically connected to the third node; and
an eighth NMOS transistor having a gate electrically connected to the eighth input node and a drain electrically connected to the fourth node.

13. The receiving device according to claim 9, further comprising:
a first resistor including one end electrically connected to the first signal line and another end electrically connected to a common node;
a second resistor including one end electrically connected to the second signal line and another end electrically connected to the common node; and
a first reference voltage generating circuit including a first common input terminal electrically connected to the common node, the first reference terminal, and the second reference terminal.

14. The receiving device according to claim 9, wherein a signal that is transferred on the pair of differential signal lines is a four-level pulse amplitude modulation (PAM4) signal.

15. A communication system comprising:
a transmitting device;
a wired differential transmission path connected to the transmitting device; and a receiving device comprising:
- a pair of differential receiving nodes connectable to a wired differential transmission path;
- a pair of differential signal lines connected to the pair of differential receiving nodes, the pair of differential signal lines including a first signal line and a second signal line;
- a first comparator including:
  - a first input node electrically connected to the first signal line;
  - a second input node electrically connectable to a first reference terminal at a first reference voltage;
  - a third input node electrically connected to the second signal line; and
  - a fourth input node electrically connectable to a second reference terminal at a second reference voltage different from the first reference voltage, wherein
  - the first comparator is configured to output at least one of a first signal corresponding to a difference between a potential of the first input node and a potential of the second input node, and a second signal corresponding to a difference between a potential of the third input node and a potential of the fourth input node; and
- a second comparator including:
  - a fifth input node electrically connected to the first signal line;
  - a sixth input node electrically connected to the second signal line;
  - a seventh input node electrically connectable to a third reference terminal at a third reference voltage different from the first reference voltage and the second reference voltage; and
  - an eighth input node electrically connectable to a fourth reference terminal at a fourth reference voltage different from the first reference voltage and the second reference voltage, wherein
  - the second comparator is configured to output at least one of a third signal corresponding to a difference between a potential of the fifth input node and a potential of the seventh input node, and a fourth signal corresponding to a difference between a potential of the sixth input node and a potential of the eighth input node; and
- an internal circuit configured to restore a value indicated by a differential signal received by the pair of differential receiving nodes based on the at least one of the first and second signals and the at least one of the third and fourth signals, wherein the third reference voltage is between the first reference voltage and the second reference voltage, the fourth reference voltage is between the first reference voltage and the second reference voltage, and the third reference voltage is equal to the fourth reference voltage.

16. The communication system according to claim 15, wherein the first comparator and the second comparator include a same circuit configuration.

17. The communication system according to claim 15, wherein the first comparator includes:
- a first NMOS transistor having a gate electrically connected to the first input node and a drain electrically connected to a first node;
- a second NMOS transistor having a gate electrically connected to the second input node and a drain electrically connected to a second node;
- a third NMOS transistor having a gate electrically connected to the third input node and a drain electrically connected to the first node; and
- a fourth NMOS transistor having a gate electrically connected to the fourth input node and a drain electrically connected to the second node.

18. The communication system according to claim 17, wherein the second comparator includes:
- a fifth NMOS transistor having a gate electrically connected to the fifth input node and a drain electrically connected to a third node;
- a sixth NMOS transistor having a gate electrically connected to the sixth input node and a drain electrically connected to a fourth node;
- a seventh NMOS transistor having a gate electrically connected to the seventh input node and a drain electrically connected to the third node; and an eighth NMOS transistor having a gate electrically connected to the eighth input node and a drain electrically connected to the fourth node.

19. The communication system according to claim 15, wherein the receiving device further comprises:
- a first resistor including one end electrically connected to the first signal line and another end electrically connected to a common node;
- a second resistor including one end electrically connected to the second signal line and another end electrically connected to the common node; and
- a first reference voltage generating circuit including a first common input terminal electrically connected to the common node, the first reference terminal, and the second reference terminal.

20. The communication system according to claim 15, wherein a signal that is transferred on the pair of differential signal lines is a four-level pulse amplitude modulation (PAM4) signal.

* * * * *